United States Patent
Gilbert, Sr.

(10) Patent No.: US 6,410,172 B1
(45) Date of Patent: Jun. 25, 2002

(54) ARTICLES COATED WITH ALUMINUM NITRIDE BY CHEMICAL VAPOR DEPOSITION

(75) Inventor: Michael H. Gilbert, Sr., North Olmsted, OH (US)

(73) Assignee: Advanced Ceramics Corporation, Lakewood, OH (US)

( * ) Notice: Subject to any disclaimer, the term of this patent is extended or adjusted under 35 U.S.C. 154(b) by 0 days.

(21) Appl. No.: 09/717,546

(22) Filed: Nov. 21, 2000

Related U.S. Application Data
(60) Provisional application No. 60/166,971, filed on Nov. 23, 1999.

(51) Int. Cl.$^7$ .................................................. B32B 9/00
(52) U.S. Cl. ........................ 428/698; 428/408; 428/699; 219/538; 219/481; 219/444.1
(58) Field of Search ................................ 428/408, 688, 428/698, 704; 338/307, 308; 219/444.1; 361/234

(56) References Cited

U.S. PATENT DOCUMENTS

| | | | |
|---|---|---|---|
| 4,172,754 A | 10/1979 | Dryburgh | |
| 4,239,819 A | 12/1980 | Holzl | |
| 4,950,558 A | 8/1990 | Sarin | |
| 5,119,541 A | 6/1992 | Ohmi et al. | |
| 5,155,652 A | 10/1992 | Logan et al. | |
| 5,178,911 A | 1/1993 | Gordon et al. | |
| 5,280,156 A * | 1/1994 | Niori et al. | 219/385 |
| 5,343,022 A | 8/1994 | Gilbert, Sr. et al. | |
| 5,356,608 A | 10/1994 | Gebhardt | |
| 5,403,401 A | 4/1995 | Haafkens et al. | |
| 5,456,757 A | 10/1995 | Aruga et al. | |
| 5,566,043 A | 10/1996 | Kawada et al. | |
| 5,573,742 A | 11/1996 | Gebhardt | |
| 5,591,269 A | 1/1997 | Arami et al. | |
| 5,606,484 A | 2/1997 | Kawada et al. | |
| 5,663,865 A | 9/1997 | Kawada et al. | |
| 5,665,260 A | 9/1997 | Kawada et al. | |
| 5,672,420 A | 9/1997 | Stinton et al. | |
| 5,683,606 A | 11/1997 | Ushikoshi et al. | |
| 5,693,581 A | 12/1997 | Honma et al. | |
| 5,702,764 A | 12/1997 | Kimura et al. | |
| 5,705,080 A | 1/1998 | Leung et al. | |
| 5,822,675 A | 10/1998 | Paquet et al. | |
| 5,837,058 A | 11/1998 | Chen et al. | |
| 5,866,883 A | 2/1999 | Hirai | |
| 5,882,730 A | 3/1999 | Kimura et al. | |
| 5,909,355 A | 6/1999 | Parkhe | |
| 6,242,719 B1 * | 6/2001 | Kano et al. | 219/444.1 |

OTHER PUBLICATIONS

Advanced Ceramics Corporation, "Boralectric Heating Elements" brochure, pp. 1–6, 1998.
Advanced Ceramics Corporation, "PG" Pyrolytic Graphite brochure, pp. 1–2, Jul. 1998.
NGK Insulators, Ltd, "Aluminum Nitride E–Chuck.", pp. 1–4, dated prior to Jun. 1999.
Toshiba Ceramics Co., Ltd., "Ceramic Heater", pp. 1–6, dated prior to Jun. 1999.

* cited by examiner

Primary Examiner—Deborah Jones
Assistant Examiner—Gwendolyn Blackwell-Rudasill
(74) Attorney, Agent, or Firm—Pearne & Gordon LLP

(57) ABSTRACT

An article with an chemical vapor deposition (CVD) aluminum nitride coating is disclosed. The article is a heating element, wafer carrier, or electrostatic chuck. The article has a substrate made of a nitride of aluminum or boron, and further has one or more graphite elements for resistance heating or electromagnetic chucking or both. A pyrolytic boron nitride layer may be provided between the substrate and the CVD aluminum nitride coating, and may either encompass or exclude the graphite element or elements.

18 Claims, 2 Drawing Sheets

ARTICLES COATED WITH ALUMINUM NITRIDE BY CHEMICAL VAPOR DEPOSITION

This application claims the benefit of U.S. Provisional Application Serial No. 60/166,971, filed Nov. 23, 1999.

FIELD OF THE INVENTION

The invention relates generally to articles having an aluminum nitride coating provided by chemical vapor deposition, and more particularly to heating units, wafer carriers, and electrostatic chucks having such a coating.

BACKGROUND OF THE INVENTION

The manufacture of computer integrated circuits (computer chips) requires deposition and selective removal of many layers of material. Various components are used in the equipment that applies these thin films to silicon wafers. They include heating elements, electrostatic chucks, and wafer carriers.

During wafer coating, some of the materials that are applied to the wafer or chip also deposit on the equipment in the deposition chamber, such as the heating equipment. This requires periodic cleaning of the equipment, which is commonly done using high energy gas plasma. The most aggressive plasma uses a At fluorine-bearing gas such as $NF_3$. This produces a fluorine plasma, which cleans the chamber but also attacks the components of the equipment. This erosion limits the life of the components and the equipment. It would be desirable to extend the service life of components and equipment by use of a suitably durable coating.

SUMMARY OF THE INVENTION

A coated article is provided. The coated article may be a heating element, electrostatic chuck, or wafer carrier. The article has a body containing a substrate and a graphite element, and also has an outer coating of aluminum nitride provided by chemical vapor deposition. The outer coating protects the article against chemical attack, for example by fluorine plasma.

DETAILED DESCRIPTION OF THE PREFERRED EMBODIMENTS OF THE INVENTION

Figure 3:
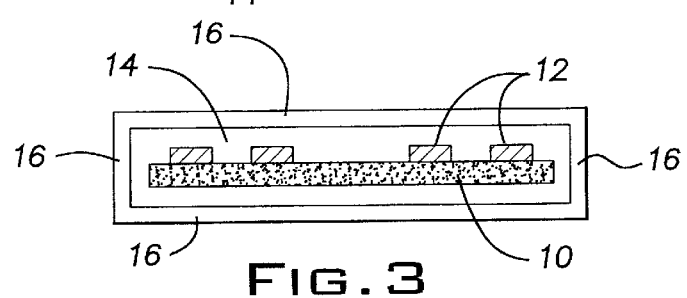
FIGS. 3, 5, 6 and 7 are partial schematic cross-sectional views of embodiments of the invention.

In the description that follows, when a preferred range, such as 5 to 25, is given, this means preferably at least 5, and separately and independently, preferably not more than 25. As used herein and in the claims, the term "adjacent" includes both direct contact and lying near, as where an intervening layer exists between two layers or objects. An example of this latter situation is shown in FIG. 3, wherein an outer layer of aluminum nitride 16 is adjacent the pyrolytic boron nitride substrate 10 and pyrolytic graphite resistors 12, and a layer of pyrolytic boron nitride 14 is disposed between the substrate 10 and the outer layer 16.

The invention concerns a coated article. The coated article may be a heating element, an electrostatic chuck, a wafer carrier, or similar article. In each case the article has a body containing a substrate and a graphite element, and also has an adjacent coating of aluminum nitride provided by chemical vapor deposition.

Figure 1:
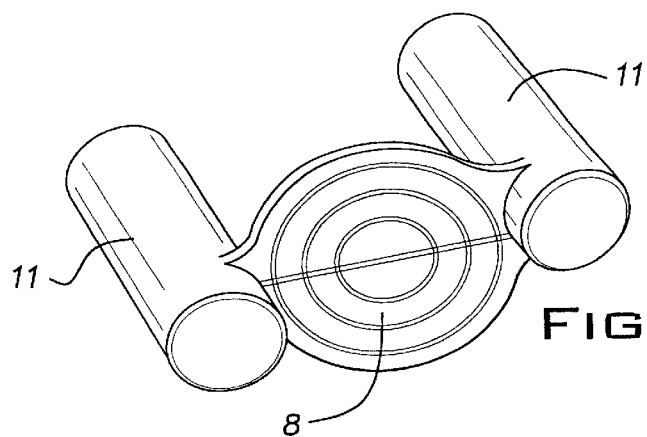
FIG. 1 is a perspective view of a heating element suitable for use in the present invention.

FIG. 1 shows a conventional heating element known in the art, such as a Boralectric brand pyrolytic boron nitride resistance (PBN) heating element available from Advanced Ceramics Corporation, Cleveland, Ohio. The heating element has a resistor 8 and a pair of connector posts 11, and is for uses such as heating silicon wafers during chemical vapor deposition of surface layers. The connector posts act to transmit electricity from a source at their base to the resistor. This PBN heating element and its construction and uses are described in more detail in U.S. Pat. No. 5,343,022, the contents of which are incorporated herein by reference in their entirety.

Figure 2:
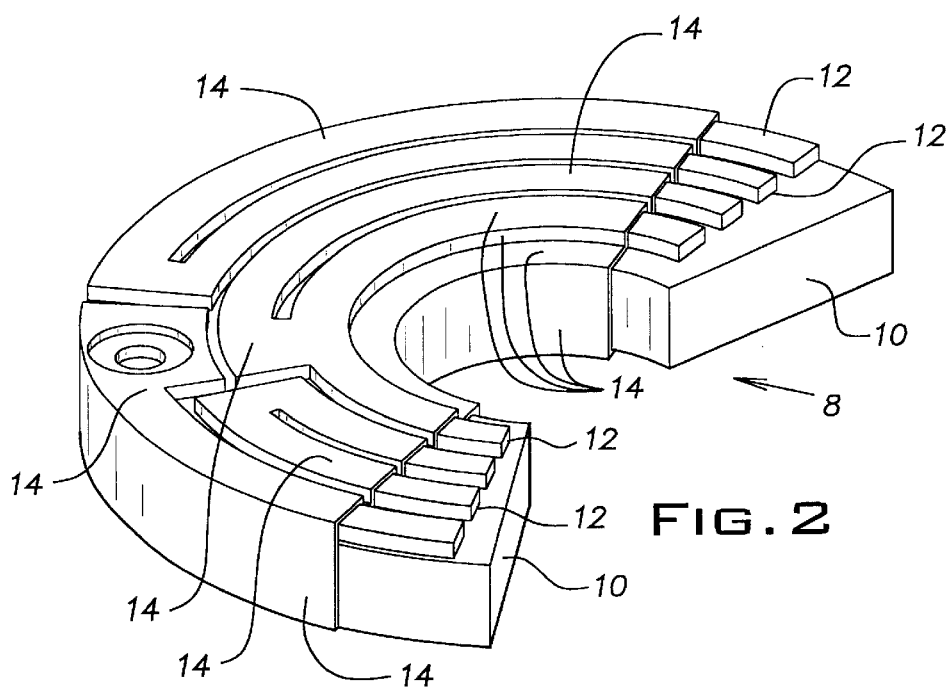
FIG. 2 is a perspective view of a portion of the heating element in FIG. 1 on a larger scale, partially cut away to reveal components.

The resistor 8 of the heating element is shown in more detail in FIG. 2, which illustrates a resistor having a PBN substrate 10 about 0.02–0.12 inches, more preferably about 0.05 inches thick and an electrically conductive serpentine pyrolytic graphite (PG) element 12 about 0.001–0.006 inches, more preferably about 0.002–0.003 inches thick, mounted on the substrate. The pyrolytic graphite element in a heater is a pyrolytic graphite resistance element or heating element with typical resistance known in the art. The PG resistance element is provided by chemical vapor deposition (CVD), and generally is machined into the desired (serpentine) configuration. The substrate and the resistance element form the body of the resistor. The body is substantially covered by a uniform protective PBN coating 14 about 0.005–0.04 inches, more preferably about 0.01–0.02 inches thick provided by CVD encapsulating the heating unit. This PBN coating 14 resists oxidation, provides electrical insulation, chemical and mechanical protection and minimizes the opportunity for carbon contamination. See also U.S. Pat. Nos. 5,882,730 and 5,702,764, the contents of which are incorporated herein by reference.

One aspect of the invention is illustrated in FIG. 3, which shows the PBN heating unit of FIGS. 1 and 2 coated with an outer protective coating 16 of aluminum nitride deposited by chemical vapor deposition (CVD-AlN). As shown in FIG. 3, there is a body comprising a substrate 10 and PG element 12. The body is coated with a PBN layer and the an CVD-AlN coating. All or substantially all of the exterior surface of the article is covered by the outermost CVD-AlN coating.

An article according to the invention is used in the processing of silicon wafers. As part of this processing involves layering of materials on the wafer by chemical vapor deposition, the article is also subject to being coated with the materials during the processing. It becomes periodically necessary to clean the article. The process of layering materials on the wafer is generally not damaging to the article. However, harsh cleaning compositions such as $NF_3$ plasma are often used to clean the surface of these articles. This cleaning is typically undertaken after 30 to 40 process hours, or hours spent processing wafers. The. article is then typically subjected to plasma cleaning for 1–2 cleaning hours or less. An article coated only with PBN is typically damaged sufficiently to require replacement after exposure to $NF_3$ plasma for 50 to 100 cleaning hours. The CVD-AlN coating is considerably more resistant to attack by $NF_3$ plasma than a PBN coating, and in testing has shown no detectable damage after 12–24 cleaning hours using $NF_3$ plasma. An article according to the invention preferably has sufficient CVD-AlN coating to effectively survive, that is, to maintain the article in a protected condition such that the coated article does not need to be replaced, for at least 10, 25, 50, 100, 200, 300, 400, 500, 600, 700, 800, 900, 1000, 1500, 2000, 3000, or 4000 cleaning hours, that is, hours of $NF_3$ plasma attack during cleaning of the article. To achieve this, the CVD-AlN outer coating 16 is preferably about 10–100 microns, more preferably about 30–80 microns, more preferably about 50–60 microns thick.

Figure 4:
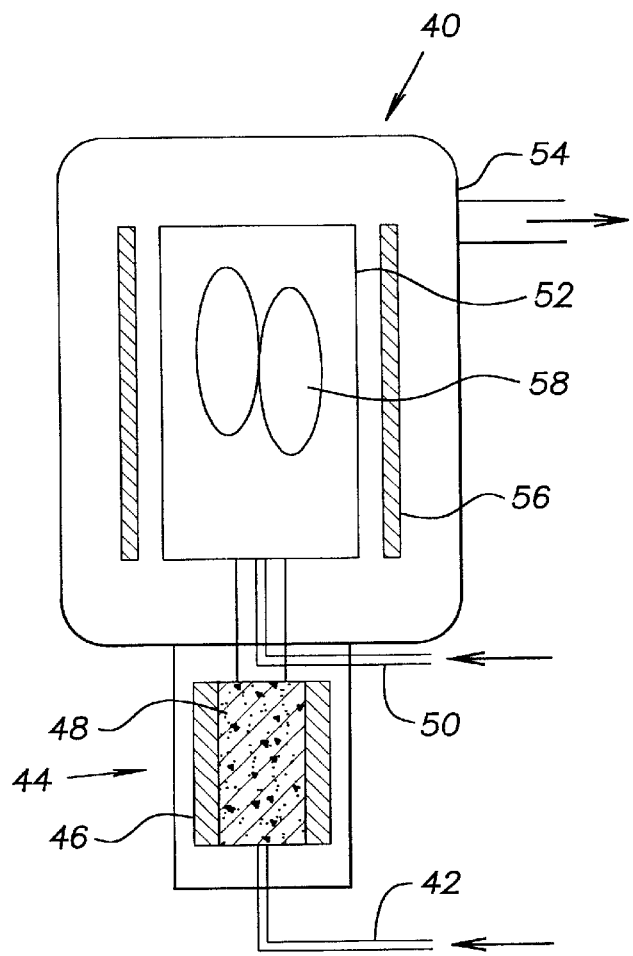
FIG. 4 is a schematic view of an apparatus for performing chemical vapor deposition.

The process of applying a CVD-AlN coating is well-known; see, for example, U.S. Pat. Nos. 4,950,558; 5,672,420; 4,239,819; 5,178,911; 4,172,754; and 5,356,608, the contents of which are incorporated by reference. FIG. 4 illustrates schematically a CVD-AlN process using $AlCl_3$ and $NH_3$. In summary, the vapor deposition process is performed in a reactor 40 having a chlorination chamber 44 in communication with a deposition chamber 52. The deposition chamber is contained within a vacuum chamber 54, which is connected to one or more vacuum pumps. Before beginning the process, the coating substrate 58 is placed in the deposition chamber 52 and the chlorination chamber 44 is loaded with a bed of aluminum particles 48. The vacuum chamber and deposition chamber are then evacuated.

To begin the process, the chlorination chamber 44 is heated to a temperature between 200° C. and 400° C. by resistive heating elements 46. Chlorine ($Cl_2$) and nitrogen ($N_2$) gas are introduced through pipe 42 into the chlorination chamber. At this temperature the aluminum and chlorine form aluminum chloride gas by the reaction: $3\ Cl_2 + 2\ Al \rightarrow 2\ AlCl_3$.

The aluminum chloride then passes into deposition chamber 52, which had previously been evacuated to a low pressure of about 1 to 10 torr, preferably about 2 torr. Ammonia ($NH_3$) and hydrogen ($H_2$) are also introduced into the deposition chamber through inlet 50. The temperature is maintained at 700° C. to 800° C., preferably 750° C. by resistive heaters 56. The coating substrate 58 is then coated with AlN as the aluminum chloride and ammonia by the reaction: $AlCl_3 + NH_3 \rightarrow AlN + 3\ HCl$.

The coating builds up on the coating substrate 58 at a rate ranging from about 10 to 20 micrometers per hour. The aluminum nitride coating resulting from chemical vapor deposition is superior to that resulting from sintering or hot-pressing, as it is very dense and highly pure, and has an essentially uniform thickness. Coatings prepared as described above exhibit density from 85 to 90 percent of the theoretical crystalline density of aluminum nitride. (Theoretical AlN crystalline density=3.26 g/cc) Preparation at a higher deposition chamber temperature of 900° C. yields an even higher density, of about 97 to 100 percent of the theoretical crystalline density. Other CVD-AlN coating processes are known in the art using other techniques and materials, all of which art is incorporated herein by reference.

Figure 5:
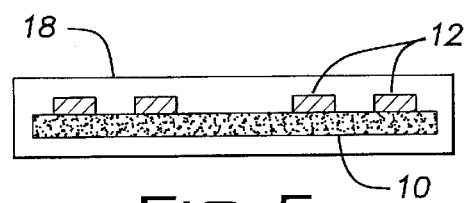

In another embodiment of the invention, the heating unit of FIG. 3 can be used, except that coating 16 is eliminated and PBN coating 14 is replaced by a CVD-AlN coating 18; this embodiment is illustrated in FIG. 5. The CVD-AlN coating 18 is preferably about 10–100 micrometers, more preferably about 30–80 micrometers, more preferably about 50–60 micrometers, optionally about 5–50 micrometers, thick.

FIGS. 3 and 5 show the use of the conventional PBN substrate 10. Alternatively, PBN substrate 10 in FIGS. 3 and 5 can be substituted by (1) a PBN-coated graphite plate (the graphite plate being about 0.10–0.75 inches thick, optionally 0.12–0.50 inches thick, the PBN coating being about 0.005–0.035 inches, more preferably about 0.015–0.020 inches thick), (2) a hot-pressed boron nitride (BN) plate about 0.10–0.75 inches, more preferably about 0.25–0.50 inches thick, or (3) a PBN-coated hot-pressed BN plate (the hot-pressed BN plate being about 0.10–0.75 inches, more preferably about 0.25–0.50 inches thick, the PBN coating being about 0.005–0.035 inches, more preferably about 0.01–0.02 inches thick).

Figure 6:
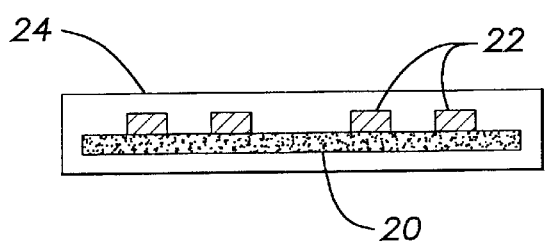

With reference to FIG. 6, there is shown a heating element similar to those of FIGS. 3 and 5, but of different materials. The heating unit of FIG. 6 has a bulk AlN substrate 20 about 0.05–0.5 inches, more preferably about 0.1–0.2 inches thick, which has been formed by hot-pressing, casting, or other known technique. The heating unit also has a pyrolytic graphite resistance element 22 about 0.001–0.006 inches, more preferably about 0.002–0.003 inches thick, provided by CVD and comparable to PG resistance element 12, and further has a CVD-AlN outer coating 24 about 10–100 micrometers, more preferably about 30–80 micrometers, more preferably about 50–60 micrometers thick. Alternatively, FIG. 6 can be an electrostatic chuck having a similar bulk AlN substrate 20 about 0.05–0.5 inches, more preferably about 0.1–0.2 inches thick, one or more CVD pyrolytic graphite electrostatic chuck electrodes 22 about 0.001–0.006 inches, more preferably about 0.002–0.003 inches thick, and a CVD-AlN outer coating 24 about 10–100 micrometers, more preferably about 30–80 micrometers, more preferably about 50–60 micrometers thick. For the design, construction, and operation of an electrostatic chuck, see U.S. Pat. Nos. 5,591,269; 5,566,043; 5,663,865; 5,606,484; 5,155,652; 5,665,260; 5,909,355; and 5,693,581, the entire contents of which are incorporated herein by reference.

Optionally, the heating element of FIG. 6 and the electrostatic chuck of FIG. 6 can be combined into a single unit. This is illustrated schematically in FIG. 7, which shows a supporting substrate 26 of the same material and thickness as bulk AlN substrate 20, heat generating layer 28 of the same material and thickness as resistance element 22 described above, electrodes 30 for an electrostatic chuck, of the same material and thickness as pyrolytic graphite conductor or electrostatic chuck electrodes 22, described above configured as an electrostatic chucking element or electrodes, and covering layer 32 the same material and thickness as CVD-AlN outer coating 24.

Figure 7:
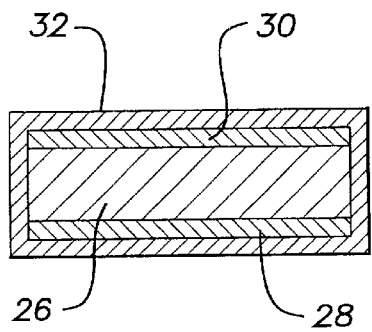

Optionally, the heating elements of FIG. 3, 5, or 6, the electrostatic chuck of FIG. 6, or the combined heating element and electrostatic chuck of FIG. 7 can be used as a wafer carrier to transfer wafers from place to place during the treatment process. In this case, each of the illustrated embodiments would also have an arm (not shown) and means to convey the heater or chuck or heater/chuck to the required locations. The section of the wafer carrier shown in the figures (the coated body) serves a function similar to the flat part of a spatula in conveying chips and wafers to different locations. A wafer carrier with a built-in heating element can pre-heat the wafer or maintain it at a desired temperature. A wafer carrier with a built-in electrostatic chuck allows greater rates of travel and quicker processing times. A wafer carrier combining both functions, as shown in FIG. 7, provides the advantages of both. For the wafer carrier to successfully insinuate itself into standard chip or wafer racks, however, the coated body must have a total thickness of less than about 3 mm. Thus, a wafer carrier according to the present invention must have a total combined thickness less than this total thickness of 3 mm.

Although the preferred embodiments of the invention have been shown and described, it should be understood that various modifications and rearrangements of the parts may be resorted to without departing from the scope of the invention as disclosed and claimed herein.

What is claimed is:

1. An article comprising a body, said body comprising a substrate and a pyrolytic graphite element mounted contiguously to the substrate, the article further comprising an insulating layer of boron nitride overlaying the substrate and the pyrolytic graphite element, the article further comprising an outer coating of aluminum nitride provided by chemical vapor deposition adjacent the body, the article being selected from the group consisting of a heating element, an electrostatic chuck, and a wafer carrier, the outer coating being effective to protect the article against attack by a cleaning composition.

2. An article according to claim 1, wherein the outer coating is about 10 to 100 micrometers thick.

3. An article according to claim 1, wherein the outer coating covers substantially all of the exterior surface of the article.

4. An article according to claim 1, wherein the pyrolytic graphite element comprises an electrode.

5. An article according to claim 1, wherein the pyrolytic graphite element comprises a resistance heating element.

6. An article according to claim 5, wherein the resistance heating element is about 0.001 to 0.006 inches thick.

7. An article according to claim 1, wherein the substrate is a pyrolytic boron nitride plate.

8. An article according to claim 1, wherein the substrate is a graphite plate, and the substrate further comprises a coating of pyrolytic boron nitride.

9. An article according to claim 1, wherein the substrate is a hot-pressed boron nitride plate.

10. An article according to claim 9, wherein the substrate further comprises a coating of pyrolytic boron nitride.

11. An article according to claim 1, wherein the substrate is an aluminum nitride plate.

12. An article according to claim 11, wherein a second pyrolytic graphite element is mounted adjacent the substrate, and the substrate is disposed between the two pyrolytic graphite elements.

13. An article according to claim 12, wherein the first pyrolytic graphite element is a resistance heating element, and the second pyrolytic graphite element is an electrode.

14. An article according to claim 1, wherein the cleaning composition is $NF_3$ plasma.

15. An article according to claim 1, wherein the outer coating is effective to allow the article to effectively survive at least 100 cleaning hours.

16. An article according to claim 1, wherein a second pyrolytic graphite element is mounted adjacent the substrate, and the substrate is disposed between the two pyrolytic graphite elements.

17. An article according to claim 16, wherein the first pyrolytic graphite element is a resistance heating element, and the second pyrolytic graphite element is an electrode.

18. An article according to claim 11, wherein the substrate further comprises a coating of pyrolytic boron nitride.

* * * * *